(12) United States Patent
Ogino et al.

(10) Patent No.: US 9,181,617 B2
(45) Date of Patent: *Nov. 10, 2015

(54) SPUTTERING TARGET OF FERROMAGNETIC MATERIAL WITH LOW GENERATION OF PARTICLES

(75) Inventors: Shin-ichi Ogino, Ibaraki (JP); Atsushi Sato, Ibaraki (JP); Yuichiro Nakamura, Ibaraki (JP); Atsutoshi Arakawa, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 77 days.

This patent is subject to a terminal disclaimer.

(21) Appl. No.: 13/808,938

(22) PCT Filed: Jan. 28, 2011

(86) PCT No.: PCT/JP2011/051766
§ 371 (c)(1),
(2), (4) Date: Jan. 8, 2013

(87) PCT Pub. No.: WO2012/011294
PCT Pub. Date: Jan. 26, 2012

(65) Prior Publication Data
US 2013/0112555 A1    May 9, 2013

(30) Foreign Application Priority Data

Jul. 20, 2010 (JP) ................................. 2010-163328
Dec. 20, 2010 (JP) ................................. 2010-283152

(51) Int. Cl.
*H01F 41/18* (2006.01)
*C23C 14/34* (2006.01)
(Continued)

(52) U.S. Cl.
CPC ........... *C23C 14/3407* (2013.01); *C22C 1/0433* (2013.01); *C22C 19/07* (2013.01);
(Continued)

(58) Field of Classification Search
CPC ....... H01F 41/183; H01F 10/16; C22C 19/07; C22C 32/0026; G11B 5/851; G11B 5/65
USPC ........................................................ 148/425
See application file for complete search history.

(56) References Cited

U.S. PATENT DOCUMENTS

| 7,909,949 B2 | 3/2011 | Nakamura et al. |
| 7,927,434 B2 | 4/2011 | Nakamura et al. |

(Continued)

FOREIGN PATENT DOCUMENTS

| JP | 2004339586 A | * | 12/2004 |
| JP | 2008223072 A | * | 9/2008 |

(Continued)

OTHER PUBLICATIONS

Machine translation of JP2004339586A, Dec. 2004.*

(Continued)

*Primary Examiner* — Jie Yang
*Assistant Examiner* — Xiaowei Su
(74) *Attorney, Agent, or Firm* — Howson & Howson LLP

(57) ABSTRACT

Provided is a sputtering target of ferromagnetic material comprising a metal having a composition containing 20 mol % or less of Cr, and Co as the remainder; wherein the target structure includes a phase (A) which is a basis metal, and metal phases (B) having a component composition different from the peripheral texture within the phase (A), the area ratio occupied by oxides within 1 μm from the most outer periphery of metal phases (B) is 80% or less, and the average grain size of the metal phases (B) is 10 μm or more and 150 μm or less. Provided is a sputtering target of ferromagnetic material capable of inhibiting the generation of particles during sputtering, and improving the pass-through flux to achieve a stable electrical discharge with a magnetron sputtering device.

20 Claims, 2 Drawing Sheets

Co atomized powder is used.

(51) Int. Cl.
*C22C 1/04* (2006.01)
*C22C 19/07* (2006.01)
*C22C 32/00* (2006.01)
*C22F 1/10* (2006.01)
*G11B 5/851* (2006.01)
*H01F 10/16* (2006.01)

(52) U.S. Cl.
CPC ............... *C22C32/0026* (2013.01); *C22F 1/10* (2013.01); *C23C 14/3414* (2013.01); *G11B 5/851* (2013.01); *H01F 41/18* (2013.01); *H01F 10/16* (2013.01)

(56) References Cited

U.S. PATENT DOCUMENTS

| | | |
|---|---|---|
| 2007/0189916 A1 | 8/2007 | Zhang |
| 2009/0229976 A1 | 9/2009 | Kato et al. |
| 2009/0242393 A1 | 10/2009 | Satoh |
| 2009/0308740 A1* | 12/2009 | Kato et al. ............... 204/298.13 |
| 2010/0243435 A1* | 9/2010 | Kato ........................ 204/298.13 |
| 2010/0270146 A1 | 10/2010 | Nonaka et al. |
| 2010/0320084 A1 | 12/2010 | Sato |
| 2011/0003177 A1* | 1/2011 | Wu et al. .................... 428/836.2 |
| 2011/0048935 A1 | 3/2011 | Koide |
| 2011/0247930 A1 | 10/2011 | Sato |
| 2011/0284373 A1 | 11/2011 | Sato et al. |
| 2012/0097535 A1* | 4/2012 | Ogino et al. ............. 204/298.13 |
| 2012/0118734 A1 | 5/2012 | Sato et al. |
| 2012/0241316 A1 | 9/2012 | Arakawa |
| 2012/0241317 A1 | 9/2012 | Ikeda et al. |
| 2012/0273347 A1 | 11/2012 | Koide |
| 2013/0001079 A1 | 1/2013 | Sato |
| 2013/0015061 A1 | 1/2013 | Sato |
| 2013/0098760 A1 | 4/2013 | Takami et al. |
| 2013/0134038 A1 | 5/2013 | Sato et al. |
| 2013/0175167 A1 | 7/2013 | Ikeda et al. |
| 2013/0206591 A1 | 8/2013 | Takami et al. |
| 2013/0206592 A1 | 8/2013 | Arakawa et al. |
| 2013/0206593 A1 | 8/2013 | Arakawa et al. |
| 2013/0213802 A1 | 8/2013 | Sato et al. |
| 2013/0213804 A1 | 8/2013 | Arakawa et al. |
| 2013/0220804 A1 | 8/2013 | Arakawa et al. |
| 2013/0248362 A1 | 9/2013 | Ogino et al. |

FOREIGN PATENT DOCUMENTS

| | | |
|---|---|---|
| JP | 4422203 B1 | 2/2010 |
| WO | WO 2009054369 A1 * | 4/2009 |

OTHER PUBLICATIONS

Machine translation of JP2008223072A, Sep. 2008.*

* cited by examiner

Co atomized powder is used.

Co-Cr atomized powder is used.

Powder, to which Co atomized powder was pulverized, is used.

Cr-Co pulverized powder is used.

SPUTTERING TARGET OF FERROMAGNETIC MATERIAL WITH LOW GENERATION OF PARTICLES

BACKGROUND

The present invention relates to a sputtering target of ferromagnetic material for use in the deposition of a magnetic thin film of a magnetic recording medium, and particularly for use in the deposition of a magnetic recording layer of a hard disk based on the perpendicular magnetic recording system; and to a sputtering target with low generation of particles which has large pass-through flux and enables a stable electrical discharge when sputtered with a magnetron sputtering device.

In the field of magnetic recording as represented with hard disk drives, a material based on Co, Fe or Ni as ferromagnetic metals is used as a magnetic-thin-film material which is used for the recording. For example, Co—Cr-based or Co—Cr—Pt-based ferromagnetic alloys comprising Co as its main component are used for the recording layer of hard disks based on the longitudinal magnetic recording system.

Moreover, composite materials of a Co—Cr—Pt-based ferromagnetic alloy comprising Co as its main component and nonmagnetic inorganic substances are often used for the recording layer of hard disks based on the perpendicular magnetic recording system which was recently put into practical application.

A magnetic thin film of a magnetic recording medium such as a hard disk is often produced by performing sputtering with a ferromagnetic sputtering target having the foregoing materials as its components in light of its high productivity.

As a method of manufacturing this kind of ferromagnetic sputtering target, the melting method or the powder-metallurgical method may be considered. It is not necessarily appropriate to suggest which method is better since it will depend on the demanded characteristics, but a sputtering target composed of a ferromagnetic alloy and nonmagnetic inorganic grains, which is used for forming the recording layer of hard disks based on the perpendicular magnetic recording system, is generally manufactured with powder metallurgy. This is because the inorganic grains need to be uniformly dispersed within the alloy basis material and this is difficult to achieve with the melting method.

For example, proposed are methods of inhibiting the generation of particles by achieving the feature that the amount of chrome oxide agglomerations with an absolute maximum length exceeding 5 µm is 500 agglomerations/mm$^2$ or less in the basis metal of a sputtering target of Co-based sintered alloy for forming a magnetic recording film, and no chrome oxide agglomeration with an absolute maximum length exceeding 10 µm exists therein (Patent Documents 1 to 3).

The foregoing Documents describe that it will be possible to achieve such feature that the amount of chrome oxide agglomerations with an absolute maximum length exceeding 5 µm is 500 agglomerations/mm$^2$ or less and no chrome oxide agglomeration with an absolute maximum length exceeding 10 µm exists, by using a Co—Cr alloy powder and/or a Cr—Pt alloy powder as raw powders. However, it might not be that the generation of particles can be sufficiently inhibited according to these Documents.

There are various types of sputtering devices, but a magnetron sputtering device comprising a DC power source is broadly used in light of its high productivity for the deposition of the foregoing magnetic recording films. The sputtering method is to place a positive-electrode substrate and a negative-electrode target opposite each other, and generate an electric field by applying high voltage between the substrate and the target under an inert gas atmosphere.

Here, inert gas is ionized, plasma composed of electrons and positive ions is formed, the positive ions in this plasma collide with the target (negative electrode) surface to discharge the constituent atoms of the target, and the extruded atoms adhere to the opposing substrate surface to form a film. The sputtering method employs a principle where the material configuring the target is deposited on the substrate as a result of performing the sequential process described above.

[Patent Document 1] Japanese Laid-Open Patent Publication No. 2008-24001
[Patent Document 2] Japanese Laid-Open Patent Publication No. 2008-88546
[Patent Document 3] Japanese Laid-Open Patent Publication No. 2007-291512

SUMMARY OF INVENTION

Generally speaking, if a magnetron sputtering device is used to perform sputtering with a ferromagnetic sputtering target; much of the magnetic flux from the magnet will pass through the target, which is a ferromagnetic body, and therefore, the pass-through flux will decrease and there is a major problem in that a discharge does not occur during the sputtering or the discharge is unstable even if a discharge does occur.

In order to overcome this problem, it is known that the target structure is intentionally made to be uneven by inputting coarse metal grains, which have a component composition different from the mother phase and are of approximately 30 to 150 µm, during the manufacturing process of the sputtering target.

After the sintering, the coarse metal grains form a metal phase, which has a component composition different from the mother phase, the specific permeability of the sputtering target lessens, and the pass-through flux increases. Thereby, it has been possible to achieve a stable discharge. However, if this metal phase was formed, particles have tended to increase.

In light of the foregoing problems, this invention aims to provide a ferromagnetic sputtering target, which is capable of obtaining a stable electrical discharge when sputtered with a magnetron sputtering device, and capable of low generation of particles during the sputtering, and has the improved pass-through flux.

In order to achieve the foregoing object, as a result of intense study, the present inventors discovered that a target with a large pass-through flux and low generation of particles can be obtained by adjusting the target structure.

Based on the forgoing discovery, the present invention provides: 1) A sputtering target of nonmagnetic-grain-dispersed ferromagnetic material in which nonmagnetic grains consisting of oxides are dispersed in a metal having a composition containing 20 mol % or less of Cr, and Co as the remainder; wherein the target structure includes a phase (A) in which nonmagnetic grains consisting of oxides are dispersed within a basis metal, and metal phases (B) having a component composition different from the basis metal within the phase (A), the area ratio occupied by oxides within 1 µm from the most outer periphery of metal phases (B) is 80% or less, and the average grain size of the metal phases (B) is 10 µm or more and 150 µm or less.

Based on the forgoing discovery, the present invention provides: 2) A sputtering target of nonmagnetic-grain-dispersed ferromagnetic material in which nonmagnetic grains consisting of oxides are dispersed in a metal having a composition containing 20 mol % or less of Cr, 5 mol % or more and 30 mol % or less of Pt, and Co as the remainder; wherein the target structure includes a phase (A) in which nonmagnetic grains consisting of oxides are dispersed within a basis metal, and metal phases (B) having a component composition different from the basis metal within the phase (A), the area ratio occupied by oxides within 1 μm from the most outer periphery of metal phases (B) is 80% or less, and the average grain size of the metal phases (B) is 10 μm or more and 150 μm or less.

The present invention further provides: 3) The sputtering target of ferromagnetic material according to 1) or 2) above, wherein the average long diameter of oxides existing within 1 μm from the most outer periphery of the metal phases (B) is 10 μm or less.

The present invention additionally provides:
4) The sputtering target of ferromagnetic material according to any one of 1) to 3) above, wherein the metal phase (B) is a flat phase having an average aspect ratio of 1:2 to 1:10.

The present invention further provides:
5) The sputtering target of ferromagnetic material according to any one of 1) to 4) above, wherein the metal phase (B) is a Co alloy phase in which the Cr content is 10 wt % or less.

The present invention further provides:
6) The sputtering target of ferromagnetic material according to any one of 1) to 5) above, wherein one or more elements selected from B, Ti, V, Mn, Zr, Nb, Ru, Mo, Ta, and W are contained as additive elements within the range of 0.5 mol % or more and 10 mol % or less.

The present invention further provides:
7) The sputtering target of ferromagnetic material according to any one of 1) to 6) above, wherein the area ratio occupied by the metal phases (B) in the cross section of the sputtering target is 15 to 50%.

A target that is adjusted as described above has a large pass-through flux, and stable electrical discharge can be obtained since ionization of inert gas will efficiently advance when the target is used in a magnetron sputtering device. Moreover, since the thickness of the target can be made thick, there is an advantage in that the replacement frequency of targets can be reduced, and a magnetic thin film can be produced with low cost. Furthermore, since the generation of particles is low, there is an advantage in that defective magnetic recording films obtained by sputter deposition can be reduced, and costs can therefore be reduced.

DETAILED DESCRIPTION

Figure 1:
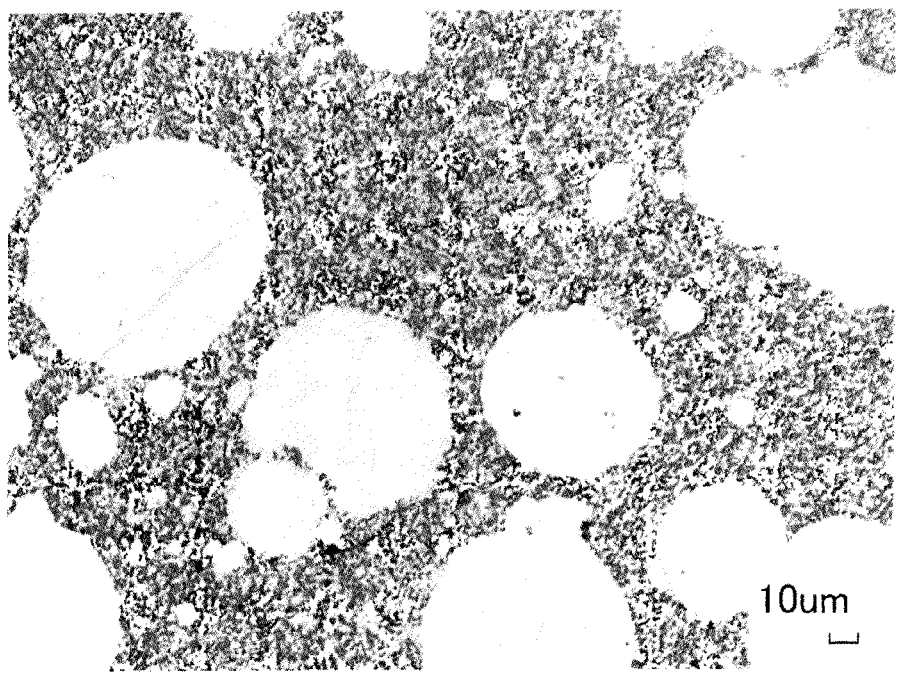
FIG. 1 This is a structure image upon observing the polished surface of the target of Example 1 under an optical microscope.

The main component configuring the ferromagnetic sputtering target of the present invention is a metal containing 20 mol % or less of Cr and Co as the remainder; or a metal containing 20 mol % or less of Cr, 5 mol % or more and 30 mol % or less of Pt, and Co as the remainder.

Note that Cr is added as an essential component and 0 mol % of Cr is therefore excluded from the foregoing range. Specifically, Cr is contained in an amount that is greater than or equal to the analyzable lower limit. If the Cr content is 20 mol % or less, an effect is yielded even in cases of adding trace amounts. The present invention covers all of the above.

These are components which are required as for the magnetic recording medium. The blending ratio may be variously changed within the foregoing range, but in any case, characteristics as an effective magnetic recording medium can be maintained.

What is important in the present invention is that the target structure includes metal phases (B) having a component composition different from the peripheral texture, the area ratio occupied by oxides within 1 μm from the most outer periphery of metal phases (B) is 80% or less, and the average grain size of the metal phases (B) is 10 μm or more and 150 μm or less.

Moreover, the average long diameter of oxides existing within 1 μm from the most outer periphery of the phases (B) is desirably 10 μm or less. If the long diameter of oxides within 1 μm from the most outer periphery exceeds 10 μm; sintering of the phase (A) and phases (B) will become insufficient, it encourages the phases (B) to flake off during the sputtering, and it causes the generation of particles.

The term "flat" or "flat shape" as used herein refers to a shape of a wedge, crescent, or quarter moon, or a shape where two or more of these shapes being connected. Moreover, when these shapes are defined quantitatively, the ratio of the short diameter and the long diameter (hereinafter referred to as the "aspect ratio") is, on average, 1:2 to 1:10.

Incidentally, the term "flat" or "flat shape" is referring to the shape when viewed from the top, and does not mean a completely planar shape without any unevenness. In other words, shapes with slight undulation and unevenness are also included in the foregoing term.

With a target having this kind of structure, it is possible to prevent, based on the wedge effect by shaping the spherical Co atomized powder into the form of a wedge, the generation of particles caused by the flaking off of the metal phases (B). Moreover, by destroying the spherical shape, it is possible to reduce the deviation in the erosion speed that occurred when the atomized powder was of a spherical shape, and inhibit the generation of particles attributable to the interface between two materials having different erosion speeds.

Preferably, the average grain size of the metal phases (B) is 10 μm or more and 150 μm or less. If the diameter of the phases (B) is less than 10 μm, diffusion of the metal elements will proceed when sintering the target materials, and the alloy composition of the phase (A) and the phases (B) will become uniform. Thus, the existence of the phases (B) will become unclear. Meanwhile, if the diameter of the phases (B) exceeds 150 μm, the target surface becomes non-smooth as the sputtering process advances, and the problem of particles tends to arise.

Moreover, since the oxides around the metal phases (B) exist in relatively large numbers within the peripheral texture and these metal phases (B) tend to flake off, it is more likely to cause the generation of particles during sputtering. Accordingly, the size of the metal phases (B) is desirably 10 μm or more and 150 μm or less.

Moreover, in the present invention, the metal phase (B) is desirably a Co alloy phase which contains 10 wt % or less of Cr. In the foregoing case, since the Cr oxide has low standard free energy of formation, the oxides within the phase (A)

become reduced and it leads the Cr oxides to exist on the outer periphery of the metal phases (B).

In the present invention, it is also possible to contain 0.5 mol % or more and 10 mol % or less of one or more elements selected from B, Ti, V, Mn, Zr, Nb, Ru, Mo, Ta, and W as additive elements.

These are the elements which are added as needed in order to improve the characteristics as a magnetic recording medium.

Moreover, the ferromagnetic sputtering target of the present invention can contain inorganic material of oxide in a dispersed state within the basis metal. In the foregoing case, the present invention comprises favorable characteristics as a material of a magnetic recording film with a granular structure; particularly a recording film of a hard disk drive based on the perpendicular magnetic recording system.

Moreover, nitrides, carbides or carbonitrides can be used as substitute for the inorganic material of oxide. These inorganic materials can also be combined to use. These materials can possess the equivalent function to the oxide.

A target that is adjusted as described above becomes a target with a large pass-through flux, and stable electrical discharge can be obtained since ionization of inert gas will efficiently advance when this target is used in a magnetron sputtering device. Moreover, since the thickness of the target can be made thick, there is an advantage in that the replacement frequency of targets can be reduced, and a magnetic thin film can be produced with low cost.

In addition, as a result of being able to reduce the deviation of the erosion speed and prevent the metal phases from flaking off, there is also an advance in that the generation of particles, which cause the deterioration in the production yield, can be reduced.

The ferromagnetic sputtering target of the present invention is manufactured with the melting method or powder metallurgy. In the case of powder metallurgy, the powders of the respective metal elements, and as needed, the powders of the additive metal elements are prepared. Desirably, the maximum grain size of these powders is 20 μm or less. Moreover, the alloy powders of these metals may also be prepared in substitute for the powders of the respective metal elements, but it is desirable that the maximum grain size is also 20 μm or less even in such a case.

Meanwhile, if the grain size is too small, there is a problem in that oxidation is promoted and the component composition will not fall within the intended range. Thus, it is desirable that the grain size is 0.1 μm or more.

Subsequently, these metal powders are weighed to achieve the intended composition, mixed and pulverized with well-known methods such as ball milling. If inorganic powder is to be added, it should be added and mixed with the metal powders at this stage.

Carbon powder, oxide powder, nitride powder, carbide powder or carbonitride powder is prepared as the inorganic powder, and it is desirable that the maximum grain size of the inorganic powder is 5 μm or less. Meanwhile, if the grain size is too small, the powders become clumped together, and therefore the grain size is desirably 0.1 μm or more.

In addition, Co atomized powder with a diameter within the range of 10 to 300 μm is prepared, and the Co atomized powder and the foregoing mixed powder are pulverized and further mixed using a high-energy ball mill. The high-energy ball mill here is able to pulverize and mix the raw powders in a short period of time in comparison to a ball mill or a vibrating mill.

Otherwise, the prepared Co atomized powder with a diameter within the range of 50 to 300 μm can be pulverized alone to prepare coarse grains, and these grains may be mixed with the foregoing mixed powder. As the mixing device, a mixer or a mortar without pulverizing force is preferably used. Moreover, mixing is preferably performed in an inert gas atmosphere or a vacuum in consideration of the problem of oxidation during the mixing process.

The powder obtained as described above is molded and sintered using a vacuum hot press device and this is cut into the intended shape in order to prepare the ferromagnetic sputtering target of the present invention. Moreover, the molding and sintering processes are not limited to hot press, and the plasma discharge sintering method or the hot isostatic sintering method may also be used. The holding temperature during sintering is preferably set to the lowest temperature within the temperature range in which the target will become sufficiently densified.

Although this will depend on the target composition, in many cases the temperature is within the range of 800 to 1200° C. This is because the crystal growth of a sintered compact can be inhibited by keeping the sintering temperature low. Moreover, the pressure during sintering is preferably 300 to 500 kg/cm$^2$.

EXAMPLES

The present invention is now explained in detail with reference to the Examples and Comparative Examples. Note that these Examples are merely illustrative, and the present invention shall in no way be limited thereby. In other words, various modifications and other embodiments are covered by the present invention, and the present invention is limited only by the scope of its claims.

Example 1, and Comparative Example 1

In Example 1, Co powder with an average grain size of 3 μm, Cr powder with an average grain size of 5 μm, SiO$_2$ powder with an average grain size of 1 μm, and Co atomized powder with a diameter within the range of 50 to 150 μm were prepared as the raw powders. The Co powder, Cr powder, SiO$_2$ powder, and Co atomized powder were respectively weighed to achieve a target composition of 80.7Co-12Cr-7.3SiO$_2$ (mol %).

Subsequently, the Co powder, Cr powder, SiO$_2$ powder and Co atomized powder were placed, together with zirconia balls as the grinding medium, in a ball mill pot with a capacity of 10 liters, and it was rotated for 20 hours to mix the raw powders.

This mixed powder was filled in a carbon mold, and hot pressed in a vacuum atmosphere under the following conditions; namely, temperature of 1100° C., holding time of 2 hours, and welding pressure of 30 MPa; to obtain a sintered compact. This sintered compact was cut with a lathe to obtain a disk-shaped target with a diameter of 180 mm and a thickness of 5 mm.

(Evaluation of Number of Particles)

Since it is difficult to observe the difference in the number of particles with a film thickness that is generally adopted for the products (thickness of a recording layer is 5 to 10 nm), the number of particles was evaluated by increasing the film thickness approximately 200 times (thickness of 1000 nm) in comparison to the usual film thickness and thereby increasing the absolute number of particles. The results are shown in Table 1.

(Measurement Method of Pass-Through Flux)

Moreover, the pass-through flux was measured according to ASTM F2086-01 (Standard Test Method for Pass Through Flux of Circular Magnetic Sputtering Targets, Method 2). The pass-through flux density measured by fixing the target center and rotating it 0 degree, 30 degrees, 60 degrees, 90 degrees, and 120 degrees was divided by the value of the reference field defined in the ASTM and represented in percentage by multiplying 100 thereto. The result of averaging the foregoing five points is indicated in Table 1 as the average pass-through flux density (PTF (%)).

(Measurement Method of Area Ratio of Oxide)

The area ratio occupied by oxides within 1 μm from the most outer periphery of the metal phases (B) was measured by using a cut plane of a sintered compact (including a sputtering target) to measure the (total) area of the oxides existing in the viewing field enlarged 220 times, and dividing this by the (total) area within 1 μm from the most outer periphery of the metal phases (B). This process was performed at five arbitrary viewing fields and the measured values were averaged. Note that a metal phase (B) that is partially contained in the viewing field was excluded. Moreover, the metal phases (B) were measured only for those with a short diameter of 4 μm or more. The results are shown in Table 1.

(Measurement Method of Average Long Diameter of Oxides)

The long diameter of oxides existing within 1 μm from the most outer periphery of the metal phases (B) was measured by using a cut plane of a sintered compact (including a sputtering target) to measure the long diameter of the oxides existing in the viewing field enlarged 220 times, and taking the average thereof. This process was performed at five arbitrary viewing fields and the measured values were averaged. Note that a metal phase (B) that is partially contained in the viewing field was excluded. Moreover, the metal phases (B) were measured only for those with a short diameter of 4 μm or more. The results are shown in Table 1.

(Measurement Method of Size of Metal Phase (B))

The size of the metal phase (B) was measured by counting the number of metal phases (B) in a segment of 30 cm on a photograph enlarged 220 times of a cut plane of a sintered compact (including a sputtering target), and obtaining the average value (μm) of the cut length thereof. The results are shown as the average grain size in Table 1.

(Measurement Method of Aspect Ratio of Metal Phase (B))

Moreover, the aspect ratio of the metal phase (B) was measured by observing the cut plane of a sintered compact (including a sputtering target) under a microscope, measuring the short diameter and long diameter of the metal phases (B) existing in the viewing field enlarged 220 times, and taking the average thereof. This process was performed at five arbitrary viewing fields and the measured values were averaged. Note that a metal phase (B) that is partially contained in the viewing field was excluded. Moreover, the metal phases (B) were measured only for those with a short diameter of 4 μm or more. The results are shown in Table 1.

Although not indicated in the Table, the area ratio occupied by the metal phases (B) can be obtained by observing the cut plane of a sintered compact (including a sputtering target) under a microscope, measuring the area of the metal phases (B) existing in the viewing field enlarged 220 times, and dividing this by the overall area of the viewing field. Moreover, this process may be performed at five arbitrary viewing fields and the measured values are averaged in order to improve the accuracy. Note that, as with the measurement of the aspect ratio, a metal phase (B) that is partially contained in the viewing field was excluded. Moreover, the metal phases (B) were measured only for those with a short diameter of 4 μm or more. The results were 15% or more and 50% or less.

Although not indicated in the Table, the existence ratio of grains having the intended shape among the metal phases (B) was measured by observing the cut plane of a sintered compact under a microscope, counting the number of grains having the intended shape (flat shape including a wedge shape and the like) among the metal phases (B) existing in the viewing field enlarged 220 times, and dividing this by the number of metal phases (B) existing in the overall viewing field. This process was performed at five arbitrary viewing fields and the measured values were averaged. Note that a metal phase (B) that is partially contained in the viewing field was excluded. Moreover, the metal phases (B) were measured only for those with a short diameter of 4 μm or more. The results were 90% or more.

In Comparative Example 1, Co powder with an average grain size of 3 μm, Cr powder with an average grain size of 5 μm, $SiO_2$ powder with an average grain size of 1 μm, and Co—Cr atomized powder with a diameter within the range of 30 to 150 μm were prepared as the raw powders. The Co powder, Cr powder, $SiO_2$ powder, and Co—Cr atomized powder were respectively weighed to achieve a target composition of 80.7Co-12Cr-7.3$SiO_2$ (mol %).

These powders were placed, together with zirconia balls as the grinding medium, in a ball mill pot with a capacity of 10 liters, and it was rotated for 20 hours to mix the raw powders.

Subsequently, the foregoing mixed powder was filled in a carbon mold, and hot pressed in a vacuum atmosphere under the following conditions; namely, temperature of 1100° C., holding time of 2 hours, and welding pressure of 30 MPa; to obtain a sintered compact. This sintered compact was cut with a lathe to obtain a disk-shaped target with a diameter of 180 mm and a thickness of 5 mm. As regards this target, the number of particles was counted and the average pass-through flux density was measured. The results are shown in Table 1.

TABLE 1

|  | Composition Ratio (mol %) | Composition Ratio ( wt %) | Type of Corse Grains |
|---|---|---|---|
| Example 1 | 80.7Co—12Cr—7.3$SiO_2$ | 81.74-10.72-7.54 | Co atomized powder |
| Comparative Example 1 | 80.7Co—12Cr—7.3$SiO_2$ | 81.74-10.72-7.54 | Co—Cr atomized powder |
| Example 2 | 80.7Co—12Cr—7.3$SiO_2$ | 81.74-10.72-7.54 | Powder to which Co atomized powder was pulverized |
| Comparative Example 2 | 80.7Co—12Cr—7.3$SiO_2$ | 81.74-10.72-7.54 | Co—Cr pulverized powder |
| Example 3 | 66Co—10Cr—15Pt—3$TiO_2$—2$SiO_2$—4$Cr_2O_3$ | 46.84-6.26-35.24-2.89-1.45-7.32 | Powder to which Co atomized powder was pulverized |
| Comparative Example 3 | 66Co—10Cr—15Pt—3$TiO_2$—2$SiO_2$—4$Cr_2O_3$ | 46.84-6.26-35.24-2.89-1.45-7.32 | Co—Cr atomized powder |
| Example 4 | 62Co—14Cr—15Pt—2.5B—6.5$SiO_2$ | 47.30-9.42-37.88-0.35-5.06 | Powder to which Co atomized powder was pulverized |
| Comparative Example 4 | 62Co—14Cr—15Pt—2.5B—6.5$SiO_2$ | 47.30-9.42-37.88-0.35-5.06 | Co—Cr atomized powder |
| Example 5 | 73Co—17Pt—5$TiO_2$—5$Cr_2O_3$ | 49.01-37.78-4.55-8.66 | Powder to which Co atomized powder was pulverized |

TABLE 1-continued

| | | | |
|---|---|---|---|
| Comparative Example 5 | 73Co—17Pt—5TiO$_2$—5Cr$_2$O$_3$ | 49.01-37.78-4.55-8.66 | Corse grains are not used |
| Example 6 | 68Co—17Pt—5Ru—5TiO$_2$—5Cr$_2$O$_3$ | 44.58-36.90-5.62-4.44-8.45 | Powder to which Co atomized powder was pulverized |
| Comparative Example 6 | 68Co—17Pt—5Ru—5TiO$_2$—5Cr$_2$O$_3$ | 44.58-36.90-5.62-4.44-8.45 | Corse grains are not used |
| Example 7 | 70Co—5Cr—15Pt—2TiO$_2$—3SiO$_2$—5Cr$_2$O$_3$ | 44.43-3.02-33.94-5.86-1.85-2.09-8.81 | Powder to which Co atomized powder was pulverized |
| Comparative Example 7 | 70Co—5Cr—15Pt—2TiO$_2$—3SiO$_2$—5Cr$_2$O$_3$ | 44.43-3.02-33.94-5.86-1.85-2.09-8.81 | Co—Cr atomized powder |
| Example 8 | 61Co—14Cr—17Pt—2Mn—1Ta$_2$O$_5$—5SiO$_2$ | 42.34-8.57-39.06-1.29-5.20-3.54 | Powder to which Co atomized powder was pulverized |
| Comparative Example 8 | 61Co—14Cr—17Pt—2Mn—1Ta$_2$O$_5$—5SiO$_2$ | 42.34-8.57-39.06-1.29-5.20-3.54 | Co—Cr pulverized powder |
| Example 9 | 61.5Co—7Cr—16.5Pt—2Mo—4TiO$_2$—5SiO$_2$—4CoO | 43.57-4.38-38.69-2.31-3.84-3.61-3.60 | Powder to which Co atomized powder was pulverized |
| Comparative Example 9 | 61.5Co—7Cr—16.5Pt—2Mo—4TiO$_2$—5SiO$_2$—4CoO | 43.57-4.38-38.69-2.31-3.84-3.61-3.60 | Co—Cr pulverized powder |
| Example 10 | 68Co—10Cr—14Pt—8TiO$_2$ | 50.74-6.58-34.58-8.09 | Powder to which Co atomized powder was pulverized |
| Comparative Example 10 | 68Co—10Cr—14Pt—8TiO$_2$ | 50.74-6.58-34.58-8.09 | Co—Cr pulverized powder |
| Example 11 | 62Co—15Cr—17Pt—2Ta$_2$O$_5$—4SiO$_2$ | 41.17-8.79-37.37-9.96-2.71 | Powder to which Co atomized powder was pulverized |
| Comparative Example 11 | 62Co—15Cr—17Pt—2Ta$_2$O$_5$—4SiO$_2$ | 41.17-8.79-37.37-9.96-2.71 | Co—Cr pulverized powder |
| Example 12 | 57Co—17Cr—17Pt—2Ti—5SiO$_2$—2CoO | 41.44-10.91-40.91-1.18-3.71-1.85 | Powder to which Co atomized powder was pulverized |
| Comparative Example 12 | 57Co—17Cr—17Pt—2Ti—5SiO$_2$—2CoO | 41.44-10.91-40.91-1.18-3.71-1.85 | Co—Cr pulverized powder |
| Example 13 | 64Co—10Cr—15Pt—1Ta—5TiO$_2$—5SiO$_2$ | 38.06-5.25-29.53-1.83-22.30-3.03 | Powder to which Co atomized powder was pulverized |
| Comparative Example 13 | 64Co—10Cr—15Pt—1Ta—5TiO$_2$—5SiO$_2$ | 38.06-5.25-29.53-1.83-22.30-3.03 | Co—Cr pulverized powder |

| | Area Ratio of Oxides (%) | Average Long Diameter of Oxides (μm) | Average Grain Size of Metal Phases (B) (μm) | Average Aspect Ratio of Metal Phases (B) | No. of Particles in Steady State | PTF (%) |
|---|---|---|---|---|---|---|
| Example 1 | 65 | 9.2 | 70 | 1:1 | 29.3 | 60.6 |
| Comparative Example 1 | 85 | 16.8 | 70 | 1:1 | 166.7 | 52.6 |
| Example 2 | 65 | 7.1 | 30 | 1:5 | 12.3 | 54 |
| Comparative Example 2 | 85 | 12.6 | 50 | 1:3 | 22.3 | 49.7 |
| Example 3 | 55 | 6.1 | 100 | 1:5 | 2.5 | 52 |
| Comparative Example 3 | 90 | 21.2 | 70 | 1:1 | 229 | 50.9 |
| Example 4 | 70 | 3.5 | 120 | 1:6 | 5.5 | 55.2 |
| Comparative Example 4 | 85 | 16.9 | 70 | 1:1 | 185.5 | 51.2 |
| Example 5 | 65 | 7.1 | 100 | 1:10 | 3.7 | 33.6 |
| Comparative Example 5 | — | — | — | — | 4.5 | 28 |
| Example 6 | 60 | 7.5 | 70 | 1:6 | 2.6 | 38.8 |
| Comparative Example 6 | — | — | — | — | 3.5 | 32.9 |
| Example 7 | 70 | 9.0 | 30 | 1:8 | 9.1 | 38.2 |
| Comparative Example 7 | 85 | 15.6 | 70 | 1:1 | 120.5 | 36.5 |
| Example 8 | 65 | 6.9 | 80 | 1:8 | 10.1 | 67.4 |
| Comparative Example 8 | 90 | 12.9 | 50 | 1:3 | 60.2 | 65.5 |
| Example 9 | 60 | 6.5 | 80 | 1:8 | 9.5 | 39.5 |
| Comparative Example 9 | 90 | 13.4 | 50 | 1:3 | 51.5 | 38.2 |
| Example 10 | 65 | 8.1 | 30 | 1:6 | 4.2 | 43.5 |
| Comparative Example 10 | 85 | 13.9 | 50 | 1:3 | 71.2 | 41.6 |
| Example 11 | 60 | 4.9 | 70 | 1:8 | 8 | 60.1 |
| Comparative Example 11 | 90 | 14.7 | 50 | 1:3 | 50.5 | 58.2 |
| Example 12 | 65 | 7.2 | 80 | 1:5 | 10.1 | 72.1 |
| Comparative Example 12 | 90 | 14.1 | 50 | 1:3 | 90.5 | 70.8 |
| Example 13 | 60 | 8.3 | 70 | 1:6 | 8.8 | 59.8 |
| Comparative Example 13 | 85 | 17.1 | 50 | 1:3 | 70.1 | 57.1 |

As shown in Table 1, the number of particles in a steady state was 29.3 particles in Example 1, and it was confirmed that the number decreased in comparison to the 166.7 particles in Comparative Example 1. In Example 1, the average pass-through flux density was 60.6%, and a target with higher pass-through flux density than 52.6% in Comparative Example 1 could be obtained. As a result of observation with an optical microscope, the area ratio of oxides was 65% in Example 1, and a target with lower area ratio than 85% in Comparative Example 1 could be obtained.

Figure 2:
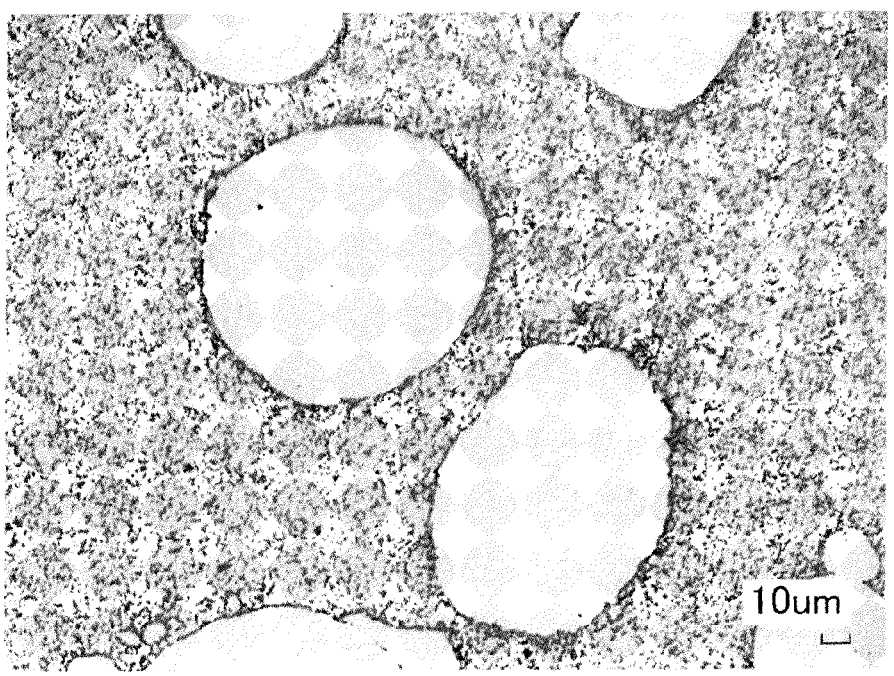
FIG. 2 This is a structure image upon observing the polished surface of the target of Comparative Example 1 under an optical microscope.

It was further confirmed that the average grain size of metal phases (B) in Example 1 was 70 μm and the metal phases (B) had an aspect ratio of 1:1 and a spherical shape. The structure image upon observing the polished target surface of Example 1 under an optical microscope is shown in FIG. 1. On the other hand, in Comparative Example 1, the average grain size of metal phases (B) was 70 μm, and the metal phases (B) had an aspect ratio of 1:1 and a spherical shape. The structure image upon observing the polished target surface of Comparative Example 1 under an optical microscope is shown in FIG. 2.

As described above, it was acknowledged that the area ratio occupied by the oxides existing within 1 μm from the most outer periphery of the metal phases (B), which have a component composition different from peripheral texture, was 80% or less in Example 1. It was found that this kind of target structure would inhibit the generation of particles during sputtering, help uniform erosion, and have a very important role to improve the pass-through flux.

Example 2, and Comparative Example 2

In Example 2, Co powder with an average grain size of 3 μm, Cr powder with an average grain size of 5 μm, $SiO_2$ powder with an average grain size of 1 μm, and a powder, to which Co atomized powder was pulverized, with a diameter within the range of 30 to 150 μm were prepared as the raw powders. The Co powder, Cr powder, $SiO_2$ powder, and the powder, to which Co atomized powder was pulverized, were respectively weighed to achieve a target composition of 80.7Co-12Cr-7.3$SiO_2$ (mol %).

Subsequently, the Co powder, Cr powder and $SiO_2$ powder were placed, together with zirconia balls as the grinding medium, in a ball mill pot with a capacity of 10 liters, and it was rotated for 20 hours to mix the raw powders. The obtained powder and the powder, to which Co atomized powder was pulverized, were further mixed for 10 minutes in a sun-and-planet motion-type mixer with a ball capacity of approximately 7 liters.

This mixed powder was filled in a carbon mold, and hot pressed in a vacuum atmosphere under the following conditions; namely, temperature of 1050° C., holding time of 2 hours, and welding pressure of 30 MPa; to obtain a sintered compact. This sintered compact was cut with a lathe to obtain a disk-shaped target with a diameter of 180 mm and a thickness of 5 mm. As regards this target, the number of particles was counted and the average pass-through flux density was measured. The results are shown in Table 1.

In Comparative Example 2, Co powder with an average grain size of 3 μm, Cr powder with an average grain size of 5 μm, $SiO_2$ powder with an average grain size of 1 μm, and Cr—Co pulverized powder with a diameter within the range of 30 to 150 μm were prepared as the raw powders. The Co powder, Cr powder, $SiO_2$ powder, and Cr—Co pulverized powder were respectively weighed to achieve a target composition of 80.7Co-12Cr-7.3$SiO_2$ (mol %).

These powders were placed, together with zirconia balls as the grinding medium, in a ball mill pot with a capacity of 10 liters, and it was rotated for 20 hours to mix the raw powders.

Subsequently, the foregoing mixed powder was filled in a carbon mold, and hot pressed in a vacuum atmosphere under the following conditions; namely, temperature of 1100° C., holding time of 2 hours, and welding pressure of 30 MPa; to obtain a sintered compact. This sintered compact was cut with a lathe to obtain a disk-shaped target with a diameter of 180 mm and a thickness of 5 mm. As regards this target, the number of particles was counted and the average pass-through flux density was measured. The results are shown in Table 1.

As shown in Table 1, the number of particles in a steady state was 12.3 particles in Example 2, and it was confirmed that the number decreased in comparison to 22.3 particles in Comparative Example 2. In Example 2, the average pass-through flux density was 54.0%, and a target with higher pass-through flux density than 49.7% in Comparative Example 2 could be obtained. As a result of observation with an optical microscope, the area ratio of oxides was 65% in Example 2, and a target with lower area ratio than 85% in Comparative Example 2 could be obtained.

Figure 3:
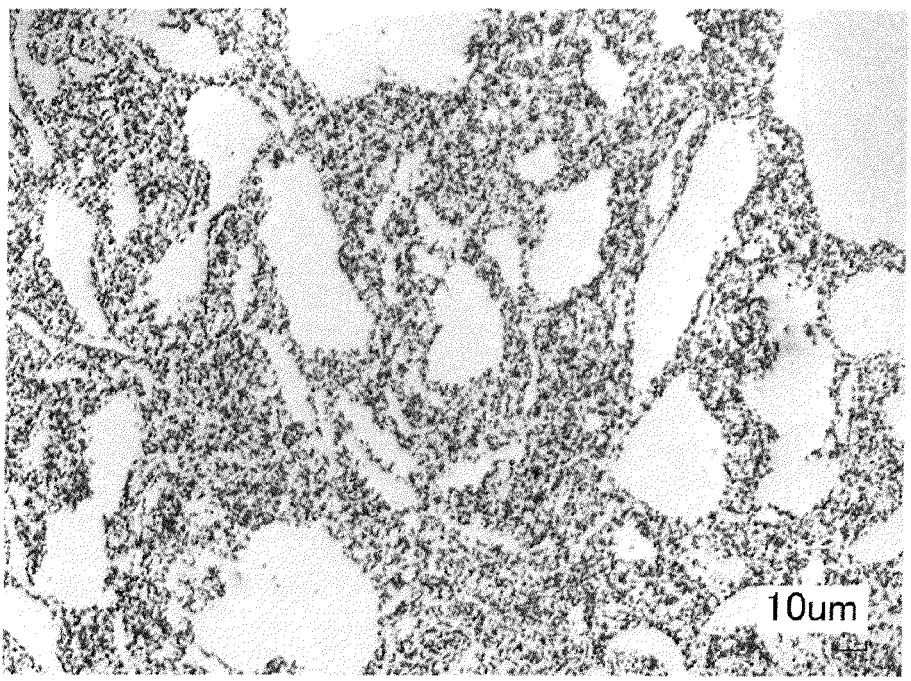
FIG. 3 This is a structure image upon observing the polished surface of the target of Example 2 under an optical microscope.
Figure 4:
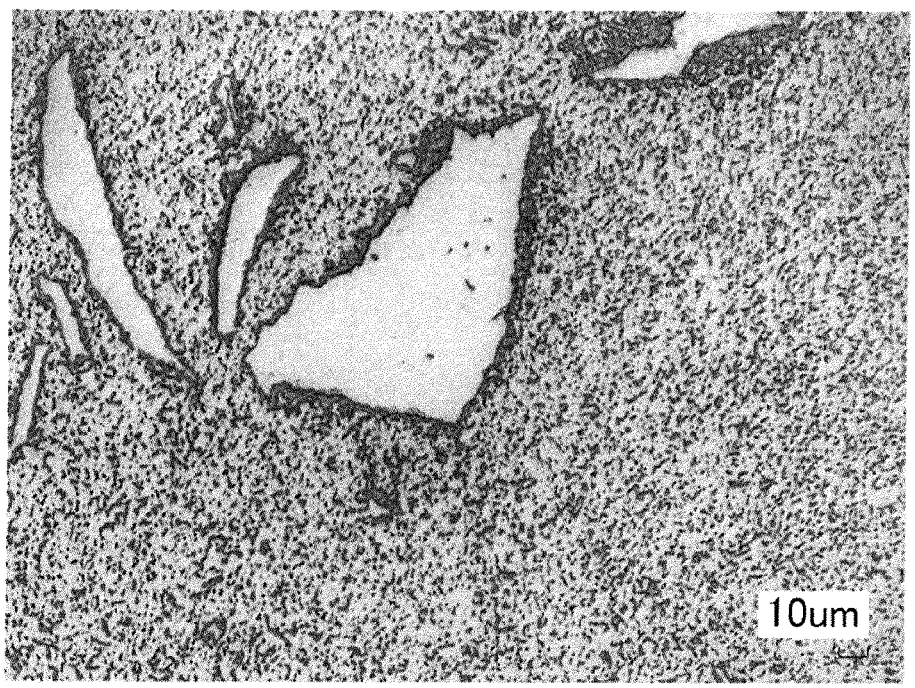
FIG. 4 This is a structure image upon observing the polished surface of the target of Comparative Example 2 under an optical microscope.

It was further confirmed that the average grain size of metal phases (B) in Example 2 was 30 μm and the metal phases (B) had an aspect ratio of 1:5 and a flat shape. The structure image upon observing the polished target surface of Example 2 under an optical microscope is shown in FIG. 3. On the other hand, in Comparative Example 2, the average grain size of metal phases (B) was 50 μm, and the metal phases (B) had an aspect ratio of 1:3 and a flat shape. The structure image upon observing the polished target surface of Comparative Example 2 under an optical microscope is shown in FIG. 4.

As described above, it was acknowledged that the area ratio occupied by the oxides existing within 1 μm from the most outer periphery of the metal phases (B), which have a component composition different from peripheral texture, was 80% or less in Example 2. It was found that this kind of target structure would inhibit the generation of particles during sputtering, help uniform erosion, and have a very important role to improve the pass-through flux.

Example 3, and Comparative Example 3

In Example 3, Co powder with an average grain size of 3 μm, Cr powder with an average grain size of 5 μm, Pt powder with an average grain size of 2 μm, $TiO_2$ powder with an average grain size of 1 μm, $SiO_2$ powder with an average grain size of 1 μm, $Cr_2O_3$ powder with an average grain size of 1 μm, and a powder, to which Co atomized powder was pulverized, with a diameter within the range of 50 to 150 μm were prepared as the raw powders. The Co powder, Cr powder, Pt powder, $TiO_2$ powder, $SiO_2$ powder, $Cr_2O_3$ powder, and a powder, to which Co atomized powder was pulverized, were respectively weighed to achieve a target composition of 66Co-10Cr-15Pt-3$TiO_2$-2$SiO_2$-4$Cr_2O_3$ (mol %).

Subsequently, the Co powder, Cr powder, Pt powder, $TiO_2$ powder, $SiO_2$ powder, and $Cr_2O_3$ powder were placed, together with zirconia balls as the grinding medium, in a ball mill pot with a capacity of 10 liters, and it was rotated for 20 hours to mix the raw powders. The obtained powder and the powder, to which Co atomized powder was pulverized, were further mixed for 10 minutes in a sun-and-planet motion-type mixer with a ball capacity of approximately 7 liters.

This mixed powder was filled in a carbon mold, and hot pressed in a vacuum atmosphere under the following conditions; namely, temperature of 1050° C., holding time of 2 hours, and welding pressure of 30 MPa; to obtain a sintered compact. This sintered compact was cut with a lathe to obtain a disk-shaped target with a diameter of 180 mm and a thickness of 5 mm. As regards this target, the number of particles was counted and the average pass-through flux density was measured. The results are shown in Table 1.

In Comparative Example 3, Co powder with an average grain size of 3 μm, Cr powder with an average grain size of 5 μm, Pt powder with an average grain size of 2 μm, $TiO_2$ powder with an average grain size of 1 μm, $SiO_2$ powder with an average grain size of 1 μm, $Cr_2O_3$ powder with an average grain size of 1 μm, and Cr—Co atomized powder with a diameter within the range of 30 to 150 μm were prepared as the raw powders. The Co powder, Cr powder, Pt powder, $TiO_2$ powder, $SiO_2$ powder, $Cr_2O_3$ powder, and Cr—Co atomized powder were respectively weighed to achieve a target composition of 66Co-10Cr-15Pt-3$TiO_2$-2$SiO_2$-4$Cr_2O_3$ (mol %).

These powders were placed, together with zirconia balls as the grinding medium, in a ball mill pot with a capacity of 10 liters, and it was rotated for 20 hours to mix the raw powders.

Subsequently, the foregoing mixed powder was filled in a carbon mold, and hot pressed in a vacuum atmosphere under the following conditions; namely, temperature of 1100° C., holding time of 2 hours, and welding pressure of 30 MPa; to obtain a sintered compact. This sintered compact was cut with a lathe to obtain a disk-shaped target with a diameter of 180 mm and a thickness of 5 mm. As regards this target, the number of particles was counted and the average pass-through flux density was measured. The results are shown in Table 1.

As shown in Table 1, the number of particles in a steady state was 2.5 particles in Example 3, and it was confirmed that the number decreased in comparison to 49.7 particles in Comparative Example 3. In Example 3, the average pass-through flux density was 52%, and a target with higher pass-through flux density than 50.9% in Comparative Example 3 could be obtained. As a result of observation with an optical microscope, the area ratio of oxides was 55% in Example 3, and a target with lower area ratio than 90% in Comparative Example 3 could be obtained.

It was further confirmed that the average grain size of metal phases (B) in Example 3 was 100 μm and the metal phases (B) had an aspect ratio of 1:5 and a flat shape. On the other hand, in Comparative Example 2, the average grain size of metal phases (B) was 70 μm, and the metal phases (B) had an aspect ratio of 1:1 and a flat shape.

As described above, it was acknowledged that the area ratio occupied by the oxides existing within 1 μm from the most outer periphery of the metal phases (B), which have a component composition different from peripheral texture, was 80% or less in Example 3. It was found that this kind of target structure would inhibit the generation of particles during sputtering, help uniform erosion, and have a very important role to improve the pass-through flux.

Example 4, and Comparative Example 4

In Example 4, Co powder with an average grain size of 3 μm, Cr powder with an average grain size of 5 μm, Pt powder with an average grain size of 2 μm, Co—B powder with an average grain size of 5 μm, $SiO_2$ powder with an average grain size of 1 μm, and a powder, to which Co atomized powder was pulverized, with a diameter within the range of 50 to 150 μm were prepared as the raw powders. The Co powder, Cr powder, Pt powder, B powder, $SiO_2$ powder, and a powder, to which Co atomized powder was pulverized, were respectively weighed to achieve a target composition of 62Co-14Cr-15Pt-2.5B-6.5$SiO_2$ (mol %).

Subsequently, the Co powder, Cr powder, Pt powder, B powder, and $SiO_2$ powder were placed, together with zirconia balls as the grinding medium, in a ball mill pot with a capacity of 10 liters, and it was rotated for 20 hours to mix the raw powders. The obtained powder and the powder, to which Co atomized powder was pulverized, were further mixed for 10 minutes in a sun-and-planet motion-type mixer with a ball capacity of approximately 7 liters.

This mixed powder was filled in a carbon mold, and hot pressed in a vacuum atmosphere under the following conditions; namely, temperature of 1050° C., holding time of 2 hours, and welding pressure of 30 MPa; to obtain a sintered compact. This sintered compact was cut with a lathe to obtain a disk-shaped target with a diameter of 180 mm and a thickness of 5 mm. As regards this target, the number of particles was counted and the average pass-through flux density was measured. The results are shown in Table 1.

In Comparative Example 4, Co powder with an average grain size of 3 μm, Cr powder with an average grain size of 5 μm, Pt powder with an average grain size of 2 μm, Co—B powder with an average grain size of 5 μm, $SiO_2$ powder with an average grain size of 1 μm, and Cr—Co atomized powder with a diameter within the range of 30 to 150 μm were prepared as the raw powders. The Co powder, Cr powder, Pt powder, B powder, $SiO_2$ powder, and Cr—Co atomized powder were respectively weighed to achieve a target composition of 62Co-14Cr-15Pt-2.5B-6.5$SiO_2$ (mol %).

These powders were placed, together with zirconia balls as the grinding medium, in a ball mill pot with a capacity of 10 liters, and it was rotated for 20 hours to mix the raw powders.

Subsequently, the foregoing mixed powder was filled in a carbon mold, and hot pressed in a vacuum atmosphere under the following conditions; namely, temperature of 1100° C., holding time of 2 hours, and welding pressure of 30 MPa; to obtain a sintered compact. This sintered compact was cut with a lathe to obtain a disk-shaped target with a diameter of 180 mm and a thickness of 5 mm. As regards this target, the number of particles was counted and the average pass-through flux density was measured. The results are shown in Table 1.

As shown in Table 1, the number of particles in a steady state was 5.5 particles in Example 4, and it was confirmed that the number decreased in comparison to 185.5 particles in Comparative Example 4. In Example 4, the average pass-through flux density was 55.2%, and a target with higher pass-through flux density than 51.2% in Comparative Example 4 could be obtained. As a result of observation with an optical microscope, the area ratio of oxides was 70% in Example 4, and a target with lower area ratio than 85% in Comparative Example 3 could be obtained.

It was further confirmed that the average grain size of metal phases (B) in Example 4 was 120 μm and the metal phases (B) had an aspect ratio of 1:6 and a flat shape. On the other hand, in Comparative Example 2, the average grain size of metal phases (B) was 70 μm, and the metal phases (B) had an aspect ratio of 1:1 and a flat shape.

As described above, it was acknowledged that the area ratio occupied by the oxides existing within 1 μm from the most outer periphery of the metal phases (B), which have a component composition different from peripheral texture, was 80% or less in Example 4. It was found that this kind of target structure would inhibit the generation of particles during sputtering, help uniform erosion, and have a very important role to improve the pass-through flux.

Example 5, and Comparative Example 5

In Example 5, Co powder with an average grain size of 3 μm, Pt powder with an average grain size of 2 μm, $TiO_2$ powder with an average grain size of 1 μm, $Cr_2O_3$ powder with an average grain size of 1 μm, and a powder, to which Co atomized powder was pulverized, with a diameter within the range of 50 to 150 μm were prepared as the raw powders. The Co powder, Pt powder, $TiO_2$ powder, $Cr_2O_3$ powder, and a powder, to which Co atomized powder was pulverized, were respectively weighed to achieve a target composition of 73Co-17Pt-5$TiO_2$-5$Cr_2O_3$ (mol %).

Subsequently, the Co powder, Pt powder, $TiO_2$ powder, and $Cr_2O_3$ powder were placed, together with zirconia balls as the grinding medium, in a ball mill pot with a capacity of 10 liters, and it was rotated for 20 hours to mix the raw powders. The obtained powder and the powder, to which Co atomized powder was pulverized, were further mixed for 10 minutes in a sun-and-planet motion-type mixer with a ball capacity of approximately 7 liters.

This mixed powder was filled in a carbon mold, and hot pressed in a vacuum atmosphere under the following conditions; namely, temperature of 1050° C., holding time of 2 hours, and welding pressure of 30 MPa; to obtain a sintered compact. This sintered compact was cut with a lathe to obtain a disk-shaped target with a diameter of 180 mm and a thickness of 5 mm. As regards this target, the number of particles was counted and the average pass-through flux density was measured. The results are shown in Table 1.

In Comparative Example 5, Co powder with an average grain size of 3 μm, Pt powder with an average grain size of 2 μm, and $TiO_2$ powder with an average grain size of 1 μm were prepared as the raw powders. The Co powder, Pt powder, $TiO_2$ powder, and $Cr_2O_3$ powder were respectively weighed to achieve a target composition of 73Co-17Pt-5$TiO_2$-5$Cr_2O_3$ (mol %).

These powders were placed, together with zirconia balls as the grinding medium, in a ball mill pot with a capacity of 10 liters, and it was rotated for 20 hours to mix the raw powders.

Subsequently, the foregoing mixed powder was filled in a carbon mold, and hot pressed in a vacuum atmosphere under the following conditions; namely, temperature of 1100° C., holding time of 2 hours, and welding pressure of 30 MPa; to obtain a sintered compact. This sintered compact was cut with a lathe to obtain a disk-shaped target with a diameter of 180 mm and a thickness of 5 mm. As regards this target, the number of particles was counted and the average pass-through flux density was measured. The results are shown in Table 1.

As shown in Table 1, the number of particles in a steady state was 3.7 particles in Example 5, and it was confirmed that the number decreased in comparison to 4.5 particles in Comparative Example 5. In Example 5, the average pass-through flux density was 33.6%, and a target with higher pass-through flux density than 28% in Comparative Example 5 could be obtained. As a result of observation with an optical microscope, the area ratio of oxides was 65% in Example 5.

It was further confirmed that the average grain size of metal phases (B) in Example 5 was 100 μm and the metal phases (B) had an aspect ratio of 1:10 and a flat shape.

As described above, it was acknowledged that the area ratio occupied by the oxides existing within 1 μm from the most outer periphery of the metal phases (B), which have a component composition different from peripheral texture, was 80% or less in Example 5. It was found that this kind of target structure would inhibit the generation of particles during sputtering, help uniform erosion, and have a very important role to improve the pass-through flux.

Example 6, and Comparative Example 6

In Example 6, Co powder with an average grain size of 3 μm, Pt powder with an average grain size of 2 μm, Ru powder with an average grain size of 8 μm, $TiO_2$ powder with an average grain size of 1 μm, $Cr_2O_3$ powder with an average grain size of 1 μm, and a powder, to which Co atomized powder was pulverized, with a diameter within the range of 50 to 150 μm were prepared as the raw powders. The Co powder, Pt powder, Ru powder, $TiO_2$ powder, $Cr_2O_3$ powder, and a powder, to which Co atomized powder was pulverized, were respectively weighed to achieve a target composition of 68Co-17Pt-5Ru-5$TiO_2$-5$Cr_2O_3$ (mol %).

Subsequently, the Co powder, Pt powder, Ru powder, $TiO_2$ powder, and $Cr_2O_3$ powder were placed, together with zirconia balls as the grinding medium, in a ball mill pot with a capacity of 10 liters, and it was rotated for 20 hours to mix the raw powders. The obtained powder and the powder, to which Co atomized powder was pulverized, were further mixed for 10 minutes in a sun-and-planet motion-type mixer with a ball capacity of approximately 7 liters.

This mixed powder was filled in a carbon mold, and hot pressed in a vacuum atmosphere under the following conditions; namely, temperature of 1050° C., holding time of 2 hours, and welding pressure of 30 MPa; to obtain a sintered compact. This sintered compact was cut with a lathe to obtain a disk-shaped target with a diameter of 180 mm and a thickness of 5 mm. As regards this target, the number of particles was counted and the average pass-through flux density was measured. The results are shown in Table 1.

In Comparative Example 6, Co powder with an average grain size of 3 μm, Pt powder with an average grain size of 2 μm, Ru powder with an average grain size of 8 μm, $TiO_2$ powder with an average grain size of 1 μm, and $Cr_2O_3$ powder with an average grain size of 1 μm were prepared as the raw powders. The Co powder, Pt powder, Ru powder, $TiO_2$ powder, and $Cr_2O_3$ powder were respectively weighed to achieve a target composition of 68Co-17Pt-5Ru-5$TiO_2$-5$Cr_2O_3$ (mol %).

These powders were placed, together with zirconia balls as the grinding medium, in a ball mill pot with a capacity of 10 liters, and it was rotated for 20 hours to mix the raw powders.

Subsequently, the foregoing mixed powder was filled in a carbon mold, and hot pressed in a vacuum atmosphere under the following conditions; namely, temperature of 1100° C., holding time of 2 hours, and welding pressure of 30 MPa; to obtain a sintered compact. This sintered compact was cut with a lathe to obtain a disk-shaped target with a diameter of 180 mm and a thickness of 5 mm. As regards this target, the number of particles was counted and the average pass-through flux density was measured. The results are shown in Table 1.

As shown in Table 1, the number of particles in a steady state was 2.6 particles in Example 6, and it was confirmed that the number decreased in comparison to 3.5 particles in Comparative Example 5. In Example 6, the average pass-through flux density was 38.8%, and a target with higher pass-through flux density than 32.9% in Comparative Example 6 could be obtained. As a result of observation with an optical microscope, the area ratio of oxides was 60% in Example 6.

It was further confirmed that the average grain size of metal phases (B) in Example 6 was 70 μm and the metal phases (B) had an aspect ratio of 1:6 and a flat shape.

As described above, it was acknowledged that the area ratio occupied by the oxides existing within 1 μm from the most outer periphery of the metal phases (B), which have a component composition different from peripheral texture, was 80% or less in Example 6. It was found that this kind of target structure would inhibit the generation of particles during sputtering, help uniform erosion, and have a very important role to improve the pass-through flux.

Example 7, and Comparative Example 7

In Example 7, Co powder with an average grain size of 3 μm, Cr powder with an average grain size of 5 μm, Pt powder with an average grain size of 2 μm, $TiO_2$ powder with an average grain size of 1 μm, $SiO_2$ powder with an average grain size of 1 μm, $Cr_2O_3$ powder with an average grain size of 1 μm, and a powder, to which Co atomized powder was pulverized, with a diameter within the range of 50 to 150 μm were prepared as the raw powders. The Co powder, Cr powder, Pt powder, $TiO_2$ powder, $SiO_2$ powder, $Cr_2O_3$ powder, and a powder, to which Co atomized powder was pulverized, were respectively weighed to achieve a target composition of 70Co-5Cr-15Pt-2$TiO_2$-3$SiO_2$-5$Cr_2O_3$ (mol %).

Subsequently, the Co powder, Cr powder, Pt powder, $TiO_2$ powder, $SiO_2$ powder, and $Cr_2O_3$ powder were placed, together with zirconia balls as the grinding medium, in a ball mill pot with a capacity of 10 liters, and it was rotated for 20 hours to mix the raw powders. The obtained powder and the powder, to which Co atomized powder was pulverized, were further mixed for 10 minutes in a sun-and-planet motion-type mixer with a ball capacity of approximately 7 liters.

This mixed powder was filled in a carbon mold, and hot pressed in a vacuum atmosphere under the following conditions; namely, temperature of 1050° C., holding time of 2 hours, and welding pressure of 30 MPa; to obtain a sintered compact. This sintered compact was cut with a lathe to obtain a disk-shaped target with a diameter of 180 mm and a thickness of 5 mm. As regards this target, the number of particles was counted and the average pass-through flux density was measured. The results are shown in Table 1.

In Comparative Example 7, Co powder with an average grain size of 3 μm, Cr powder with an average grain size of 5 μm, Pt powder with an average grain size of 2 μm, $TiO_2$ powder with an average grain size of 1 μm, $SiO_2$ powder with an average grain size of 1 μm, $Cr_2O_3$ powder with an average grain size of 1 μm, and a powder, to which Co—Cr atomized powder was pulverized, with a diameter within the range of 30 to 150 μm were prepared as the raw powders. The Co powder, Cr powder, Pt powder, $TiO_2$ powder, $SiO_2$ powder, $Cr_2O_3$ powder, and a powder, to which Co—Cr atomized powder was pulverized, were respectively weighed to achieve a target composition of 70Co-5Cr-15Pt-2$TiO_2$-3$SiO_2$-5$Cr_2O_3$ (mol %).

These powders were placed, together with zirconia balls as the grinding medium, in a ball mill pot with a capacity of 10 liters, and it was rotated for 20 hours to mix the raw powders.

Subsequently, the foregoing mixed powder was filled in a carbon mold, and hot pressed in a vacuum atmosphere under the following conditions; namely, temperature of 1100° C., holding time of 2 hours, and welding pressure of 30 MPa; to obtain a sintered compact. This sintered compact was cut with a lathe to obtain a disk-shaped target with a diameter of 180 mm and a thickness of 5 mm. As regards this target, the number of particles was counted and the average pass-through flux density was measured. The results are shown in Table 1.

As shown in Table 1, the number of particles in a steady state was 9.1 particles in Example 7, and it was confirmed that the number decreased in comparison to 120.5 particles in Comparative Example 7. In Example 7, the average pass-through flux density was 38.2%, and a target with higher pass-through flux density than 36.5% in Comparative Example 7 could be obtained. As a result of observation with an optical microscope, the area ratio of oxides was 70% in Example 7, and a target with lower area ratio than 85% in Comparative Example 7 could be obtained.

It was further confirmed that the average grain size of metal phases (B) in Example 7 was 30 μm and the metal phases (B) had an aspect ratio of 1:8 and a flat shape. On the other hand, in Comparative Example 7, the average grain size of metal phases (B) was 70 μm, and the metal phases (B) had an aspect ratio of 1:1 and a flat shape.

As described above, it was acknowledged that the area ratio occupied by the oxides existing within 1 μm from the most outer periphery of the metal phases (B), which have a component composition different from peripheral texture, was 80% or less in Example 7. It was found that this kind of target structure would inhibit the generation of particles during sputtering, help uniform erosion, and have a very important role to improve the pass-through flux.

Example 8, and Comparative Example 8

In Example 8, Co powder with an average grain size of 3 μm, Cr powder with an average grain size of 5 μm, Pt powder with an average grain size of 2 μm, Co—Mn powder with an average grain size of 5 μm, $Ta_2O_3$ powder with an average grain size of 1 μm, $SiO_2$ powder with an average grain size of 1 μm, and a powder, to which Co atomized powder was pulverized, with a diameter within the range of 50 to 150 μm were prepared as the raw powders. The Co powder, Cr powder, Pt powder, Mn powder, $Ta_2O_3$ powder, $SiO_2$ powder, and a powder, to which Co atomized powder was pulverized, were respectively weighed to achieve a target composition of 61Co-14Cr-17Pt-2Mn-1$Ta_2O_3$-5$SiO_2$ (mol %).

Subsequently, the Co powder, Cr powder, Pt powder, Mn powder, $Ta_2O_3$ powder, and $SiO_2$ powder were placed, together with zirconia balls as the grinding medium, in a ball mill pot with a capacity of 10 liters, and it was rotated for 20 hours to mix the raw powders. The obtained powder and the powder, to which Co atomized powder was pulverized, were further mixed for 10 minutes in a sun-and-planet motion-type mixer with a ball capacity of approximately 7 liters.

This mixed powder was filled in a carbon mold, and hot pressed in a vacuum atmosphere under the following conditions; namely, temperature of 1050° C., holding time of 2 hours, and welding pressure of 30 MPa; to obtain a sintered compact. This sintered compact was cut with a lathe to obtain a disk-shaped target with a diameter of 180 mm and a thickness of 5 mm. As regards this target, the number of particles was counted and the average pass-through flux density was measured. The results are shown in Table 1.

In Comparative Example 8, Co powder with an average grain size of 3 μm, Cr powder with an average grain size of 5 μm, Pt powder with an average grain size of 2 μm, Co—Mn powder with an average grain size of 5 μm, $Ta_2O_3$ powder with an average grain size of 1 μm, $SiO_2$ powder with an average grain size of 1 μm, and Co—Cr pulverized powder with a diameter within the range of 30 to 150 μm were prepared as the raw powders. The Co powder, Cr powder, Pt powder, Mn powder, $Ta_2O_3$ powder, $SiO_2$ powder, and Co—Cr pulverized powder were respectively weighed to achieve a target composition of 61Co-14Cr-17Pt-2Mn-1Ta$_2$O$_3$-5SiO$_2$ (mol %).

These powders were placed, together with zirconia balls as the grinding medium, in a ball mill pot with a capacity of 10 liters, and it was rotated for 20 hours to mix the raw powders.

Subsequently, the foregoing mixed powder was filled in a carbon mold, and hot pressed in a vacuum atmosphere under the following conditions; namely, temperature of 1100° C., holding time of 2 hours, and welding pressure of 30 MPa; to obtain a sintered compact. This sintered compact was cut with a lathe to obtain a disk-shaped target with a diameter of 180 mm and a thickness of 5 mm. As regards this target, the number of particles was counted and the average pass-through flux density was measured. The results are shown in Table 1.

As shown in Table 1, the number of particles in a steady state was 10.1 particles in Example 8, and it was confirmed that the number decreased in comparison to 60.2 particles in Comparative Example 8. In Example 8, the average pass-through flux density was 67.4%, and a target with higher pass-through flux density than 65.5% in Comparative Example 8 could be obtained. As a result of observation with an optical microscope, the area ratio of oxides was 65% in Example 8, and a target with lower area ratio than 90% in Comparative Example 8 could be obtained.

It was further confirmed that the average grain size of metal phases (B) in Example 8 was 80 μm and the metal phases (B) had an aspect ratio of 1:8 and a flat shape. On the other hand, in Comparative Example 8, the average grain size of metal phases (B) was 50 μm, and the metal phases (B) had an aspect ratio of 1:3 and a flat shape.

As described above, it was acknowledged that the area ratio occupied by the oxides existing within 1 μm from the most outer periphery of the metal phases (B), which have a component composition different from peripheral texture, was 80% or less in Example 8. It was found that this kind of target structure would inhibit the generation of particles during sputtering, help uniform erosion, and have a very important role to improve the pass-through flux.

Example 9, and Comparative Example 9

In Example 9, Co powder with an average grain size of 3 μm, Cr powder with an average grain size of 5 μm, Pt powder with an average grain size of 2 μm, Mo powder with an average grain size of 5 μm, TiO$_2$ powder with an average grain size of 1 μm, SiO$_2$ powder with an average grain size of 1 μm, CoO powder with an average grain size of 1 μm, and a powder, to which Co atomized powder was pulverized, with a diameter within the range of 50 to 150 μm were prepared as the raw powders. The Co powder, Cr powder, Pt powder, Mo powder, TiO$_2$ powder, SiO$_2$ powder, CoO powder, and a powder, to which Co atomized powder was pulverized, were respectively weighed to achieve a target composition of 61.5Co-7Cr-16.5Pt-2Mo-4TiO$_2$-5SiO$_2$-4CoO (mol %).

Subsequently, the Co powder, Cr powder, Pt powder, Mo powder, TiO$_2$ powder, SiO$_2$ powder, and CoO powder were placed, together with zirconia balls as the grinding medium, in a ball mill pot with a capacity of 10 liters, and it was rotated for 20 hours to mix the raw powders. The obtained powder and the powder, to which Co atomized powder was pulverized, were further mixed for 10 minutes in a sun-and-planet motion-type mixer with a ball capacity of approximately 7 liters.

This mixed powder was filled in a carbon mold, and hot pressed in a vacuum atmosphere under the following conditions; namely, temperature of 1050° C., holding time of 2 hours, and welding pressure of 30 MPa; to obtain a sintered compact. This sintered compact was cut with a lathe to obtain a disk-shaped target with a diameter of 180 mm and a thickness of 5 mm. As regards this target, the number of particles was counted and the average pass-through flux density was measured. The results are shown in Table 1.

In Comparative Example 9, Co powder with an average grain size of 3 μm, Cr powder with an average grain size of 5 μm, Pt powder with an average grain size of 2 μm, Mo powder with an average grain size of 5 μm, TiO$_2$ powder with an average grain size of 1 μm, SiO$_2$ powder with an average grain size of 1 μm, CoO powder with an average grain size of 1 μm, and Co—Cr pulverized powder with a diameter within the range of 50 to 150 μm were prepared as the raw powders. The Co powder, Cr powder, Pt powder, Mo powder, TiO$_2$ powder, SiO$_2$ powder, CoO powder, and Co—Cr pulverized powder were respectively weighed to achieve a target composition of 61.5Co-7Cr-16.5Pt-2Mo-4TiO$_2$-5SiO$_2$-4CoO (mol %).

These powders were placed, together with zirconia balls as the grinding medium, in a ball mill pot with a capacity of 10 liters, and it was rotated for 20 hours to mix the raw powders.

Subsequently, the foregoing mixed powder was filled in a carbon mold, and hot pressed in a vacuum atmosphere under the following conditions; namely, temperature of 1100° C., holding time of 2 hours, and welding pressure of 30 MPa; to obtain a sintered compact. This sintered compact was cut with a lathe to obtain a disk-shaped target with a diameter of 180 mm and a thickness of 5 mm. As regards this target, the number of particles was counted and the average pass-through flux density was measured. The results are shown in Table 1.

As shown in Table 1, the number of particles in a steady state was 9.5 particles in Example 9, and it was confirmed that the number decreased in comparison to 51.5 particles in Comparative Example 9. In Example 9, the average pass-through flux density was 39.5%, and a target with higher pass-through flux density than 38.2% in Comparative Example 9 could be obtained. As a result of observation with an optical microscope, the area ratio of oxides was 60% in Example 9, and a target with lower area ratio than 90% in Comparative Example 9 could be obtained.

It was further confirmed that the average grain size of metal phases (B) in Example 9 was 80 μm and the metal phases (B) had an aspect ratio of 1:8 and a flat shape. On the other hand, in Comparative Example 8, the average grain size of metal phases (B) was 50 μm, and the metal phases (B) had an aspect ratio of 1:3 and a flat shape.

As described above, it was acknowledged that the area ratio occupied by the oxides existing within 1 μm from the most outer periphery of the metal phases (B), which have a component composition different from peripheral texture, was 80% or less in Example 9. It was found that this kind of target structure would inhibit the generation of particles during sputtering, help uniform erosion, and have a very important role to improve the pass-through flux.

Example 10, and Comparative Example 10

In Example 10, Co powder with an average grain size of 3 μm, Cr powder with an average grain size of 5 μm, Pt powder with an average grain size of 2 μm, TiO$_2$ powder with an average grain size of 1 μm, and a powder, to which Co atomized powder was pulverized, with a diameter within the range of 50 to 150 μm were prepared as the raw powders. The Co powder, Cr powder, Pt powder, TiO$_2$ powder, and a powder, to which Co atomized powder was pulverized, were respectively weighed to achieve a target composition of 68Co-10Cr-14Pt-8TiO$_2$ (mol %).

Subsequently, the Co powder, Cr powder, Pt powder, and TiO$_2$ powder were placed, together with zirconia balls as the grinding medium, in a ball mill pot with a capacity of 10 liters, and it was rotated for 20 hours to mix the raw powders. The obtained powder and the powder, to which Co atomized powder was pulverized, were further mixed for 10 minutes in a sun-and-planet motion-type mixer with a ball capacity of approximately 7 liters.

This mixed powder was filled in a carbon mold, and hot pressed in a vacuum atmosphere under the following conditions; namely, temperature of 1050° C., holding time of 2 hours, and welding pressure of 30 MPa; to obtain a sintered compact. This sintered compact was cut with a lathe to obtain a disk-shaped target with a diameter of 180 mm and a thickness of 5 mm. As regards this target, the number of particles was counted and the average pass-through flux density was measured. The results are shown in Table 1.

In Comparative Example 10, Co powder with an average grain size of 3 μm, Cr powder with an average grain size of 5 μm, Pt powder with an average grain size of 2 μm, TiO$_2$ powder with an average grain size of 1 μm, and Co—Cr pulverized powder with a diameter within the range of 50 to 150 μm were prepared as the raw powders. The Co powder, Cr powder, Pt powder, TiO$_2$ powder, and Co—Cr pulverized powder were respectively weighed to achieve a target composition of 68Co-10Cr-14Pt-8TiO$_2$ (mol %).

These powders were placed, together with zirconia balls as the grinding medium, in a ball mill pot with a capacity of 10 liters, and it was rotated for 20 hours to mix the raw powders.

Subsequently, the foregoing mixed powder was filled in a carbon mold, and hot pressed in a vacuum atmosphere under the following conditions; namely, temperature of 1100° C., holding time of 2 hours, and welding pressure of 30 MPa; to obtain a sintered compact. This sintered compact was cut with a lathe to obtain a disk-shaped target with a diameter of 180 mm and a thickness of 5 mm. As regards this target, the number of particles was counted and the average pass-through flux density was measured. The results are shown in Table 1.

As shown in Table 1, the number of particles in a steady state was 4.2 particles in Example 10, and it was confirmed that the number decreased in comparison to 71.2 particles in Comparative Example 10. In Example 10, the average pass-through flux density was 43.5%, and a target with higher pass-through flux density than 41.6% in Comparative Example 10 could be obtained. As a result of observation with an optical microscope, the area ratio of oxides was 65% in Example 10, and a target with lower area ratio than 85% in Comparative Example 10 could be obtained.

It was further confirmed that the average grain size of metal phases (B) in Example 10 was 30 μm and the metal phases (B) had an aspect ratio of 1:6 and a flat shape. On the other hand, in Comparative Example 8, the average grain size of metal phases (B) was 50 μm, and the metal phases (B) had an aspect ratio of 1:3 and a flat shape.

As described above, it was acknowledged that the area ratio occupied by the oxides existing within 1 μm from the most outer periphery of the metal phases (B), which have a component composition different from peripheral texture, was 80% or less in Example 10. It was found that this kind of target structure would inhibit the generation of particles during sputtering, help uniform erosion, and have a very important role to improve the pass-through flux.

Example 11, and Comparative Example 11

In Example 11, Co powder with an average grain size of 3 μm, Cr powder with an average grain size of 5 μm, Pt powder with an average grain size of 2 μm, Ta$_2$O$_5$ powder with an average grain size of 1 μm, SiO$_2$ powder with an average grain size of 1 μm, and a powder, to which Co atomized powder was pulverized, with a diameter within the range of 50 to 150 μm were prepared as the raw powders. The Co powder, Cr powder, Pt powder, Ta$_2$O$_5$ powder, SiO$_2$ powder, and a powder, to which Co atomized powder was pulverized, were respectively weighed to achieve a target composition of 62Co-15Cr-17Pt-2Ta$_2$O$_5$-4SiO$_2$ (mol %).

Subsequently, the Co powder, Cr powder, Pt powder, Ta$_2$O$_5$ powder, and SiO$_2$ powder were placed, together with zirconia balls as the grinding medium, in a ball mill pot with a capacity of 10 liters, and it was rotated for 20 hours to mix the raw powders. The obtained powder and the powder, to which Co atomized powder was pulverized, were further mixed for 10 minutes in a sun-and-planet motion-type mixer with a ball capacity of approximately 7 liters.

This mixed powder was filled in a carbon mold, and hot pressed in a vacuum atmosphere under the following conditions; namely, temperature of 1050° C., holding time of 2 hours, and welding pressure of 30 MPa; to obtain a sintered compact. This sintered compact was cut with a lathe to obtain a disk-shaped target with a diameter of 180 mm and a thickness of 5 mm. As regards this target, the number of particles was counted and the average pass-through flux density was measured. The results are shown in Table 1.

In Comparative Example 11, Co powder with an average grain size of 3 μm, Cr powder with an average grain size of 5 μm, Pt powder with an average grain size of 2 μm, Ta$_2$O$_5$ powder with an average grain size of 1 μm, SiO$_2$ powder with an average grain size of 1 μm, and Co—Cr pulverized powder with a diameter within the range of 50 to 150 μm were prepared as the raw powders. The Co powder, Cr powder, Pt powder, Ta$_2$O$_5$ powder, SiO$_2$ powder, and Co—Cr pulverized powder were respectively weighed to achieve a target composition of 62Co-15Cr-17Pt-2Ta$_2$O$_5$-4SiO$_2$ (mol %).

These powders were placed, together with zirconia balls as the grinding medium, in a ball mill pot with a capacity of 10 liters, and it was rotated for 20 hours to mix the raw powders.

Subsequently, the foregoing mixed powder was filled in a carbon mold, and hot pressed in a vacuum atmosphere under the following conditions; namely, temperature of 1100° C., holding time of 2 hours, and welding pressure of 30 MPa; to obtain a sintered compact. This sintered compact was cut with a lathe to obtain a disk-shaped target with a diameter of 180 mm and a thickness of 5 mm. As regards this target, the number of particles was counted and the average pass-through flux density was measured. The results are shown in Table 1.

As shown in Table 1, the number of particles in a steady state was 8 particles in Example 11, and it was confirmed that the number decreased in comparison to 50.5 particles in Comparative Example 11. In Example 11, the average pass-through flux density was 60.1%, and a target with higher pass-through flux density than 58.2% in Comparative Example 11 could be obtained. As a result of observation with an optical microscope, the area ratio of oxides was 60% in Example 11, and a target with lower area ratio than 90% in Comparative Example 11 could be obtained.

It was further confirmed that the average grain size of metal phases (B) in Example 11 was 70 μm and the metal phases (B) had an aspect ratio of 1:8 and a flat shape. On the other hand, in Comparative Example 11, the average grain size of metal phases (B) was 50 μm, and the metal phases (B) had an aspect ratio of 1:3 and a flat shape.

As described above, it was acknowledged that the area ratio occupied by the oxides existing within 1 μm from the most outer periphery of the metal phases (B), which have a component composition different from peripheral texture, was 80% or less in Example 11. It was found that this kind of target structure would inhibit the generation of particles during sputtering, help uniform erosion, and have a very important role to improve the pass-through flux.

Example 12, and Comparative Example 12

In Example 12, Co powder with an average grain size of 3 μm, Cr powder with an average grain size of 5 μm, Pt powder with an average grain size of 2 μm, Ti powder with an average grain size of 30 μm, $SiO_2$ powder with an average grain size of 1 μm, CoO powder with an average grain size of 1 μm, and a powder, to which Co atomized powder was pulverized, with a diameter within the range of 50 to 150 μm were prepared as the raw powders. The Co powder, Cr powder, Pt powder, Ti powder, $SiO_2$ powder, CoO powder, and a powder, to which Co atomized powder was pulverized, were respectively weighed to achieve a target composition of 57Co-17Cr-17Pt-2Ti-5$SiO_2$-2CoO (mol %).

Subsequently, the Co powder, Cr powder, Pt powder, Ti powder, $SiO_2$ powder, and CoO powder were placed, together with zirconia balls as the grinding medium, in a ball mill pot with a capacity of 10 liters, and it was rotated for 20 hours to mix the raw powders. The obtained powder and the powder, to which Co atomized powder was pulverized, were further mixed for 10 minutes in a sun-and-planet motion-type mixer with a ball capacity of approximately 7 liters.

This mixed powder was filled in a carbon mold, and hot pressed in a vacuum atmosphere under the following conditions; namely, temperature of 1050° C., holding time of 2 hours, and welding pressure of 30 MPa; to obtain a sintered compact. This sintered compact was cut with a lathe to obtain a disk-shaped target with a diameter of 180 mm and a thickness of 5 mm. As regards this target, the number of particles was counted and the average pass-through flux density was measured. The results are shown in Table 1.

In Comparative Example 12, Co powder with an average grain size of 3 μm, Cr powder with an average grain size of 5 μm, Pt powder with an average grain size of 2 μm, Ti powder with an average grain size of 30 μm, $SiO_2$ powder with an average grain size of 1 μm, CoO powder with an average grain size of 1 μm, and Co—Cr pulverized powder with a diameter within the range of 30 to 150 μm were prepared as the raw powders. The Co powder, Cr powder, Pt powder, Ti powder, $SiO_2$ powder, CoO powder, and Co—Cr pulverized powder were respectively weighed to achieve a target composition of 57Co-17Cr-17Pt-2Ti-5$SiO_2$-2CoO (mol %).

These powders were placed, together with zirconia balls as the grinding medium, in a ball mill pot with a capacity of 10 liters, and it was rotated for 20 hours to mix the raw powders.

Subsequently, the foregoing mixed powder was filled in a carbon mold, and hot pressed in a vacuum atmosphere under the following conditions; namely, temperature of 1100° C., holding time of 2 hours, and welding pressure of 30 MPa; to obtain a sintered compact. This sintered compact was cut with a lathe to obtain a disk-shaped target with a diameter of 180 mm and a thickness of 5 mm. As regards this target, the number of particles was counted and the average pass-through flux density was measured. The results are shown in Table 1.

As shown in Table 1, the number of particles in a steady state was 10.1 particles in Example 12, and it was confirmed that the number decreased in comparison to 90.5 particles in Comparative Example 12. In Example 12, the average pass-through flux density was 72.1%, and a target with higher pass-through flux density than 70.8% in Comparative Example 11 could be obtained. As a result of observation with an optical microscope, the area ratio of oxides was 65% in Example 12, and a target with lower area ratio than 90% in Comparative Example 11 could be obtained.

It was further confirmed that the average grain size of metal phases (B) in Example 12 was 80 μm and the metal phases (B) had an aspect ratio of 1:5 and a flat shape. On the other hand, in Comparative Example 12, the average grain size of metal phases (B) was 50 μm, and the metal phases (B) had an aspect ratio of 1:3 and a flat shape.

As described above, it was acknowledged that the area ratio occupied by the oxides existing within 1 μm from the most outer periphery of the metal phases (B), which have a component composition different from peripheral texture, was 80% or less in Example 12. It was found that this kind of target structure would inhibit the generation of particles during sputtering, help uniform erosion, and have a very important role to improve the pass-through flux.

Example 13, and Comparative Example 13

In Example 13, Co powder with an average grain size of 3 μm, Cr powder with an average grain size of 5 μm, Pt powder with an average grain size of 2 μm, Ta powder with an average grain size of 100 μm, $TiO_2$ powder with an average grain size of 1 μm, $SiO_2$ powder with an average grain size of 1 μm, and a powder, to which Co atomized powder was pulverized, with a diameter within the range of 50 to 150 μm were prepared as the raw powders. The Co powder, Cr powder, Pt powder, Ta powder, $TiO_2$ powder, $SiO_2$ powder, and a powder, to which Co atomized powder was pulverized, were respectively weighed to achieve a target composition of 64Co-10Cr-15Pt-1Ta-5$TiO_2$-5$SiO_2$ (mol %).

Subsequently, the Co powder, Cr powder, Pt powder, Ta powder, $TiO_2$ powder, and $SiO_2$ powder were placed, together with zirconia balls as the grinding medium, in a ball mill pot with a capacity of 10 liters, and it was rotated for 20 hours to mix the raw powders. The obtained powder and the powder, to which Co atomized powder was pulverized, were further mixed for 10 minutes in a sun-and-planet motion-type mixer with a ball capacity of approximately 7 liters.

This mixed powder was filled in a carbon mold, and hot pressed in a vacuum atmosphere under the following conditions; namely, temperature of 1050° C., holding time of 2 hours, and welding pressure of 30 MPa; to obtain a sintered compact. This sintered compact was cut with a lathe to obtain a disk-shaped target with a diameter of 180 mm and a thickness of 5 mm. As regards this target, the number of particles was counted and the average pass-through flux density was measured. The results are shown in Table 1.

In Comparative Example 12, Co powder with an average grain size of 3 μm, Cr powder with an average grain size of 5 μm, Pt powder with an average grain size of 2 μm, Ta powder with an average grain size of 100 μm, $TiO_2$ powder with an average grain size of 1 μm, $SiO_2$ powder with an average grain size of 1 μm, and Co—Cr pulverized powder with a diameter within the range of 30 to 150 μm were prepared as the raw powders. The Co powder, Cr powder, Pt powder, Ta powder, TiO$_2$ powder, SiO$_2$ powder, and Co—Cr pulverized powder were respectively weighed to achieve a target composition of 64Co-10Cr-15Pt-1Ta-5TiO$_2$-5SiO$_2$ (mol %).

These powders were placed, together with zirconia balls as the grinding medium, in a ball mill pot with a capacity of 10 liters, and it was rotated for 20 hours to mix the raw powders.

Subsequently, the foregoing mixed powder was filled in a carbon mold, and hot pressed in a vacuum atmosphere under the following conditions; namely, temperature of 1100° C., holding time of 2 hours, and welding pressure of 30 MPa; to obtain a sintered compact. This sintered compact was cut with a lathe to obtain a disk-shaped target with a diameter of 180 mm and a thickness of 5 mm. As regards this target, the number of particles was counted and the average pass-through flux density was measured. The results are shown in Table 1.

As shown in Table 1, the number of particles in a steady state was 8.8 particles in Example 13, and it was confirmed that the number decreased in comparison to 90.5 particles in Comparative Example 13. In Example 13, the average pass-through flux density was 59.8%, and a target with higher pass-through flux density than 57.1% in Comparative Example 13 could be obtained. As a result of observation with an optical microscope, the area ratio of oxides was 60% in Example 13, and a target with lower area ratio than 85% in Comparative Example 13 could be obtained.

It was further confirmed that the average grain size of metal phases (B) in Example 13 was 70 μm and the metal phases (B) had an aspect ratio of 1:6 and a flat shape. On the other hand, in Comparative Example 13, the average grain size of metal phases (B) was 50 μm, and the metal phases (B) had an aspect ratio of 1:3 and a flat shape.

As described above, it was acknowledged that the area ratio occupied by the oxides existing within 1 μm from the most outer periphery of the metal phases (B), which have a component composition different from peripheral texture, was 80% or less in Example 13. It was found that this kind of target structure would inhibit the generation of particles during sputtering, help uniform erosion, and have a very important role to improve the pass-through flux.

The present invention enables the generation of particles to be significantly inhibited and the pass-through flux to be improved by adjusting the structure of the ferromagnetic sputtering target. Accordingly, by using the target of the present invention, a stable discharge can be obtained during sputtering performed with a magnetron sputtering device. In addition, since the target thickness can be increased, the target life can be prolonged and a magnetic thin film can be produced with low cost. Moreover, the quality of the film formed through sputtering can be significantly improved. The present invention is useful as a sputtering target of ferromagnetic material for use in the deposition of a magnetic thin film of a magnetic recording medium, and particularly for use in the deposition of a recording layer of a hard disk drive.

The invention claimed is:

1. A sputtering target of a ferromagnetic material consisting of metallic phases and non-magnetic oxide grains, said metallic phases consisting of a phase (A) and a Co-based alloy phase (B) and consisting of a composition as a whole of 20 mol % or less of Cr and Co as the remainder; wherein the sputtering target has a structure in which the phase (A) forms a matrix thereof consisting of Cr and Co, the Co-based alloy phase (B) has a different composition than that of the phase (A) and exists as grains dispersed in the phase (A), and the non-magnetic oxide grains are dispersed only within the phase (A), wherein, in a cross-section of the sputtering target, the oxide grains occupy an area of 80% or less of an area of the phase (A) existing between a periphery line of the Co-based alloy phase (B) and a line having a distance of 2 μm from the periphery line, and wherein the grains of the Co-based alloy phase (B) have an average grain size of 10 μm or more and 150 μm or less.

2. The sputtering target of ferromagnetic material according to claim 1, wherein, in a cross-section of the sputtering target, the oxide grains existing in said area between the periphery line of the Co-based alloy phase (B) and the line having a distance of 2 μm from the periphery line have long diameters thereof of an average length of 10 μm or less.

3. The sputtering target of ferromagnetic material according to claim 2, wherein the grains of the Co-based alloy phase (B) have an average aspect ratio of 1:2 to 1:10.

4. The sputtering target of ferromagnetic material according to claim 3, wherein the grains of the Co-based alloy phase (B) have a flat shape and a Cr content of 10 wt % or less.

5. The sputtering target of ferromagnetic material according to claim 4, wherein the grains of the Co-based alloy phase (B) in the cross section of the sputtering target occupy 15 to 50% of a total area of the cross section.

6. The sputtering target of ferromagnetic material according to claim 1, wherein the grains of the Co-based alloy phase (B) have an average aspect ratio of 1:2 to 1:10.

7. The sputtering target of ferromagnetic material according to claim 1, wherein the grains of the Co-based alloy phase (B) have a flat shape and a Cr content of 10 wt % or less.

8. The sputtering target of ferromagnetic material according to claim 1, wherein the grains of the Co-based alloy phase (B) in a cross section of the sputtering target occupy 15 to 50% of a total area of the cross section.

9. A sputtering target of a ferromagnetic material consisting of metallic phases and non-magnetic oxide grains, said metallic phases consisting of a phase (A) and a Co-based alloy phase (B) and consisting of a composition as a whole of 20 mol % or less of Cr, 5 mol % or more and 30 mol % or less of Pt, and Co as the remainder; wherein the sputtering target has a structure in which the phase (A) forms a matrix thereof consisting of Cr, Pt and Co, the Co-based alloy phase (B) has a different composition than that of the phase (A) and exists as grains dispersed in the phase (A), and the non-magnetic oxide grains are dispersed only within the phase (A), wherein, in a cross-section of the sputtering target, the oxide grains occupy an area of 80% or less of an area of the phase (A) existing between a periphery line of the Co-based alloy phase (B) and a line having a distance of 2 μm from the periphery line, and wherein the grains of the Co-based alloy phase (B) have an average grain size of 10 μm or more and 150 μm or less.

10. The sputtering target of ferromagnetic material according to claim 9, wherein, in a cross-section of the sputtering target, the oxide grains existing in said area between the periphery line of the Co-based alloy phase (B) and the line having a distance of 2 μm from the periphery line have long diameters thereof of an average length of 10 μm or less.

11. The sputtering target of ferromagnetic material according to claim 10, wherein the grains of the Co-based alloy phase (B) have an average aspect ratio of 1:2 to 1:10.

12. The sputtering target of ferromagnetic material according to claim 11, wherein the grains of the Co-based alloy phase (B) have a flat shape and a Cr content of 10 wt % or less.

13. The sputtering target of ferromagnetic material according to claim 12, wherein the grains of the Co-based alloy phase (B) in the cross section of the sputtering target occupy 15 to 50% of a total area of the cross section.

14. The sputtering target of ferromagnetic material according to claim 9, wherein the grains of the Co-based alloy phase (B) have an average aspect ratio of 1:2 to 1:10.

15. The sputtering target of ferromagnetic material according to claim 9, wherein the grains of the Co-based alloy phase (B) have a flat shape and a Cr content of 10 wt % or less.

16. The sputtering target of ferromagnetic material according to claim 9, wherein the grains of the Co-based alloy phase (B) in a cross section of the sputtering target occupy 15 to 50% of a total area of the cross section.

17. A sputtering target of a ferromagnetic material consisting of metallic phases and non-magnetic oxide grains, said metallic phases consisting of a phase (A) and a Co-based alloy phase (B) and consisting of a composition as a whole of 20 mol % or less of Cr, one or more additive element selected from B, Ti, V, Mn, Zr, Nb, Ru, Mo, Ta, and W within a range of 0.5 mol % or more and 10 mol % or less, and Co as the remainder; wherein the sputtering target has a structure in which the phase (A) forms a matrix thereof consisting of Cr, the additive element, and Co, wherein the Co-based alloy phase (B) has a different composition than that of the phase (A) and exists as grains dispersed in the phase (A), and the non-magnetic oxide grains are dispersed only within the phase (A), wherein, in a cross-section of the sputtering target, the oxide grains occupy an area of 80% or less of an area of the phase (A) existing between a periphery line of the Co-based alloy phase (B) and a line having a distance of 2 μm from the periphery line, and wherein the grains of the Co-based alloy phase (B) have an average grain size of 10 μm or more and 150 μm or less.

18. The sputtering target according to claim 17, wherein, in a cross-section of the sputtering target, the oxide grains existing in said area between the periphery line of the Co-based alloy phase (B) and the line having a distance of 2 μm from the periphery line have long diameters thereof of an average length of 10 μm or less.

19. The sputtering target according to claim 18, wherein the grains of the Co-based alloy phase (B) have an average aspect ratio of 1:2 to 1:10 and a Cr content of 10 wt % or less, and wherein the grains of the Co-based alloy phase (B) in the cross section of the sputtering target occupy 15 to 50% of a total area of the cross section.

20. A sputtering target of a ferromagnetic material consisting of:

metallic phases and non-magnetic oxide grains, said metallic phases consisting of a phase (A) and a Co-based alloy phase (B) and consisting of a composition as a whole of 20 mol % or less of Cr, 5 to 30 mol % of Pt, one or more additive element selected from B, Ti, V, Mn, Zr, Nb, Ru, Mo, Ta, and W within a range of 0.5 mol % or more and 10 mol % or less, and Co as the remainder;

wherein the sputtering target has a structure in which the phase (A) forms a matrix thereof consisting of Cr, Pt, the additive element, and Co;

wherein the Co-based alloy phase (B) has a different composition than that of the phase (A) and exists as grains dispersed in the phase (A), and the non-magnetic oxide grains are dispersed only within the phase (A);

wherein, in a cross-section of the sputtering target, the oxide grains occupy an area of 80% or less of an area of the phase (A) existing between a periphery line of the Co-based alloy phase (B) and a line having a distance of 2 μm from the periphery line; and wherein the grains of the Co-based alloy phase (B) have an average grain size of 10 μm or more and 150 μm or less.

* * * * *